United States Patent
Oliaei (10) Patent No.: US 7,180,432 B2
(45) Date of Patent: Feb. 20, 2007

(54) METHOD AND APPARATUS FOR COMPLEX CASCADE SIGMA-DELTA MODULATION AND SINGLE-SIDEBAND ANALOG-TO-DIGITAL CONVERSION

(75) Inventor: Omid Oliaei, Schaumburg, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 10/788,588

(22) Filed: Feb. 27, 2004

(65) Prior Publication Data

US 2005/0191980 A1    Sep. 1, 2005

(51) Int. Cl.
*H03M 3/00*    (2006.01)

(52) U.S. Cl. .......................... 341/43; 341/155

(58) Field of Classification Search ................ 341/143, 341/155; 375/244, 346, 350, 345; 455/296, 455/130
See application file for complete search history.

(56) References Cited

U.S. PATENT DOCUMENTS

| | | | |
|---|---|---|---|
| 5,442,353 A * | 8/1995 | Jackson | 341/143 |
| 6,148,048 A * | 11/2000 | Kerth et al. | 375/350 |
| 6,225,928 B1 | 5/2001 | Green | 341/143 |
| 6,243,430 B1 * | 6/2001 | Mathe | 375/346 |
| 6,329,939 B1 * | 12/2001 | Swaminathan et al. | 341/143 |
| 6,538,592 B1 * | 3/2003 | Yang et al. | 341/155 |
| 6,590,943 B1 * | 7/2003 | Ali | 375/332 |
| 6,597,748 B1 * | 7/2003 | Hietala et al. | 375/324 |

OTHER PUBLICATIONS

Jantzi et al., "Quadrature bandpass ΔΣ modulation for digital radio," *IEEE Journal of Solid-State Circuits*, 32(12):1935-1950, 1997, no month.

Salo, "Bandpass delta-sigma modulators for radio receivers," Helsinki University of Technology, *Electronic Circuit Design Laboratory Report 36*, Espoo 2003, no month.

* cited by examiner

*Primary Examiner*—Linh V. Nguyen
(74) *Attorney, Agent, or Firm*—Fulbright & Jaworski LLP (57) ABSTRACT

A complex cascade sigma-delta modulator for analog-to-digital conversion applications. The modulator includes first and second sigma-delta modulator stages, combined with a complex digital noise cancellation circuit. In addition, analog-to-digital conversion of baseband signals using a complex sigma-delta modulator is also presented.

12 Claims, 7 Drawing Sheets

METHOD AND APPARATUS FOR COMPLEX CASCADE SIGMA-DELTA MODULATION AND SINGLE-SIDEBAND ANALOG-TO-DIGITAL CONVERSION

BACKGROUND OF THE INVENTION

1. Field of the Invention

The invention relates generally to complex analog-to-digital converters, and more specifically to methods and apparatus for complex sigma-delta modulation.

2. Discussion of the Related Art

Analog-to-digital converters (ADCs) are used to convert analog information to digital information so that signal processing may be accomplished in the digital domain. In particular, sigma-delta ADCs are useful in such applications. Sigma-delta ADCs convert incoming analog signals in a particular frequency span of interest into a high-rate (oversampled), low resolution (one-bit) digital output data stream. The sigma-delta approach to analog-to-digital conversion is well-known for its superior linearity and anti-aliasing performance compared to traditional ADC conversion approaches with lower sampling rates.

In order to maintain the full performance of sigma-delta conversion, it is desirable to implement a "complex" converter, which may be thought of as converting a pair of input signals into streams of digital output values, one such stream representing the "real" or "in-phase" (I) component of the signal, and the other such stream representing the "imaginary" or "quadrature" (Q) component of the signal. It is convenient and common to represent the two output data streams I and Q as a single complex data stream I+jQ, where j is a symbol representing the square root of −1.

The advantages of sigma-delta modulators come at some expense. For example, the quantization of the signal produces noise in the output data stream, known as quantization noise. An important job of a sigma-delta converter is to "shape" this quantization noise out of the frequency range which contains the desired signal, so that subsequent digital filtering operations may recover the desired signal without corruption. In a subsequent stage, this out-of-band quantization noise may be eliminated by means of a filter. In the case of a low-pass sigma-delta modulator, the band of interest spans a frequency range centered around DC, as shown in FIG. 1A, whereas in a bandpass sigma-delta modulator, the center frequency is shifted to a higher frequency, as shown in FIG. 1B.

Two basic possibilities to improve the performance of sigma-delta modulators are the use of a higher-order modulator, or the use of a multi-bit quantizer. These approaches are not necessarily the most effective solutions. The former leads to system instability and latter may cause non-linearity. Cascading of low-order single-bit modulators has been proven to be an efficient way to achieve a higher performance without facing the above-mentioned problems. Cascaded modulators require a digital noise cancellation circuit to remove the quantization noise introduced by the first stages. Consequently, the output quantization noise will be ideally due to the very last stage of the modulator.

Figure 1A:
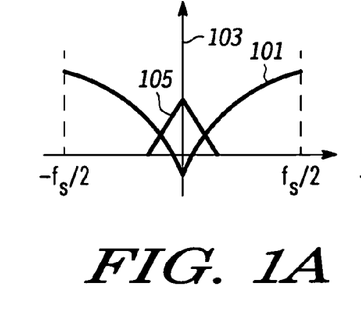
FIGS. 1A and 1B are graphs of signal and quantization noise spectra.
Figure 1B:
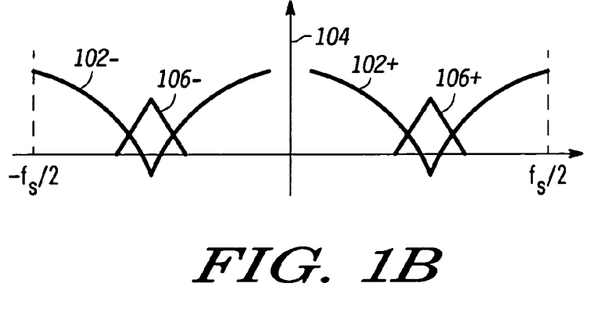
Figure 2:
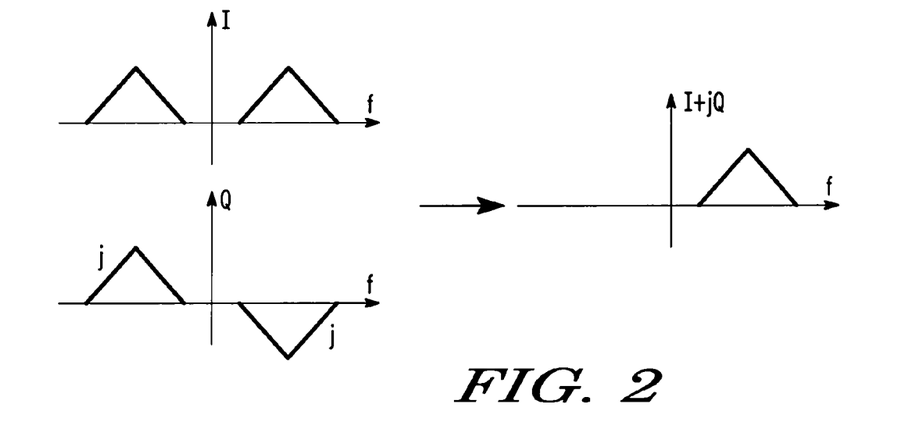
FIG. 2 are graphs of quadrature bandpass signals.

As may be seen in references FIGS. 1A and 1B, quantization noise 101, 102+ and 102− and the desired signal 105, 106+ and 106− all remain symmetric with respect to the vertical axes 103, 104 for both the low-pass and bandpass modulators. This way of shaping the quantization noise is wasteful when one side of the spectrum, for example, positive frequencies, provides all the information carried by the signal. For instance, the quanrature bandpass signal shown in FIG. 2 exhibits such a property. This property has been the main motivation for using complex sigma-delta modulators for quanrature bandpass signals. A complex sigma-delta modulator may be implemented using two real modulators with the interconnections between them in such a way that the output complex signal, $y_r+jy_i$, exhibits an asymmetric spectrum for quantization noise.

However, it is not possible to use the same principle for baseband signals because the complex signal I+jQ has spectral content at both positive and negative frequencies. For this reason, only real sigma-delta modulators with a symmetric noise shaping characteristic have been used for direct conversion systems, and two real sigma-delta modulators have been required to process the in-phase and quadrature components.

A single complex modulator is far more efficient in terms of noise shaping than two real modulators operating separately with $x_r=I$ and $x_i=Q$. In other words, for a given number of integrators, a complex sigma-delta modulator provides a better signal-to-noise (SNR) ratio. Alternatively, for a given SNR, a complex modulator requires a smaller number of integrators. This, in turn, translates into a smaller chip area and lower power consumption. The main issue with both cascade and complex modulators is their sensitivity to variation of coefficients. Inaccuracy of the coefficients in a complex modulator degrades the quality of noise shaping and causes image leakage. In a cascade structure, mismatch between the coefficients of the modulator and the coefficients of the digital noise cancellation circuit limits the achievable SNR.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those of ordinary skill in the art from this disclosure.

The present invention solves the above-noted discrepancies in prior approached to sigma-delta modulation. One aspect of the invention contemplates a complex cascade sigma-delta modulator comprised of at least two cascaded complex sigma-delta modulators combined with a digital complex noise cancellation circuit. In addition, another aspect of the invention is the use of complex sigma-delta modulators for baseband signals having negligible frequency-spectral content about DC. This results in higher efficiency in analog-to-digital conversion because the required bandwidth of the sigma-delta modulator is halved. In addition, it provides a sigma-delta modulator that enjoys high performance without at the same time suffering inaccuracy due to variation of coefficients. Furthermore, it permits use complex sigma-delta modulators for baseband signals which results in simplified structure, cost and efficiency.

Figure 3A:
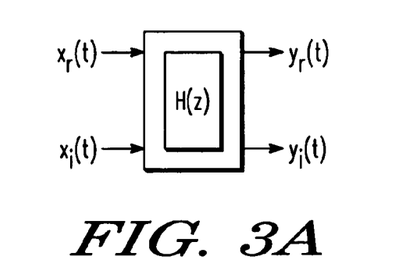
FIG. 3A is an example of a complex system having complex input and output signals.
Figure 3B:
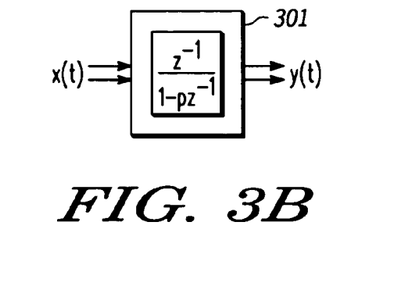
FIG. 3B is an example of a complex integrator.
Figure 3C:
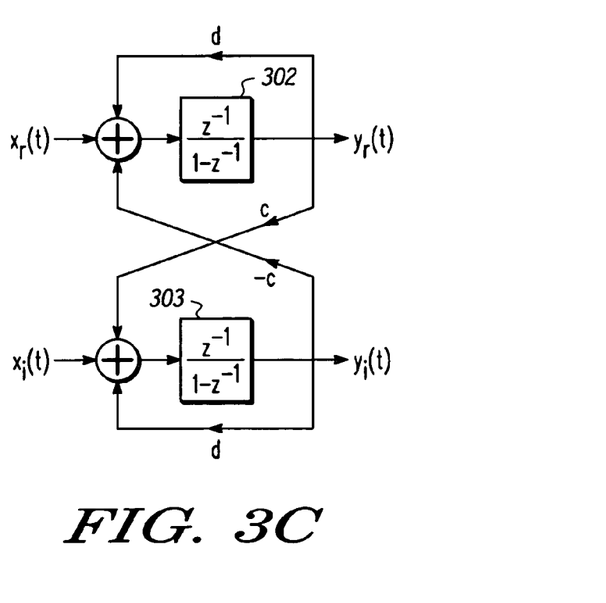
FIG. 3C is the complex integrator of FIG. 3B implemented with interconnected real integrators.

A complex signal x(t) may be represented by its real and imaginary parts as: $x(t)=x_r(t)+jx_i(t)$. Similarly, the impulse response of a complex linear system, h(t), may be represented by its real and imaginary parts: $h(t)=h_r(t)+jh_i(t)$. In the frequency domain, the transfer function of the system becomes $H(z)=H_r(z)+jH_i(z)$. Therefore, the complex system shown in FIG. 3A may be implemented using two real systems. As an example, the complex integrator 301 shown in FIG. 3B may be realized as shown in FIG. 3C, by interconnecting two real integrators 302, 303. The complex output signal is similarly given by $y(t)=y_r(t)+jy_i(t)$. The complex integrator 301 has a complex pole at $p=1+d+jc$, where d and c are selectable coefficients.

Figure 4A:
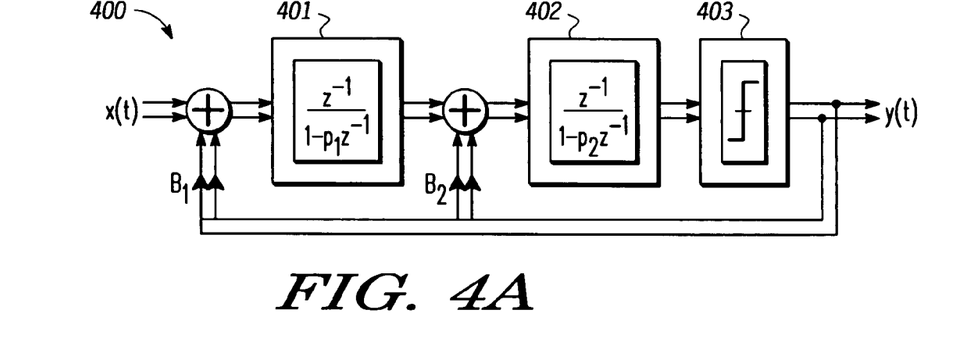
FIG. 4A is a block diagram of a complex second-order sigma-delta modulator.
Figure 4B:
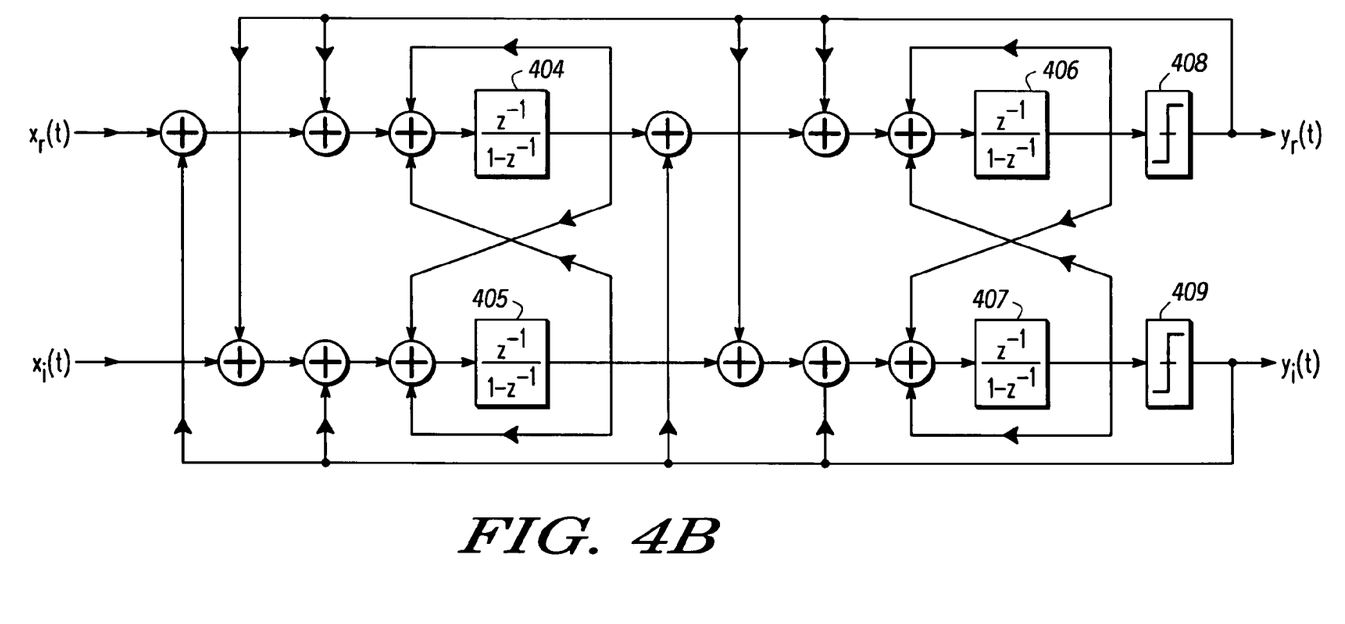
FIG. 4B is an implementation of the complex second-order sigma-delta modulator of FIG. 4B, using real integrators.

Based on this concept of complex systems, the second-order complex sigma-delta modulator shown schematically in FIG. 4A may be implemented using four real integrators as shown in FIG. 4B.

Referring to FIG. 4A, complex sigma-delta modulator 400 is comprised of two complex integrators 401, 402, combined with a complex quantizer 403. Referring to FIG. 4B, in a real implementation, and using the principals discussed above with reference to FIGS. 3B and 3C, complex integrator 401 may be implemented using two real integrators, 404, 405, complex integrator 402 may be implemented using two real integrators 406, 407, and complex quantizer 403 may be implemented using two real quantizers 408, 409.

Figure 5:
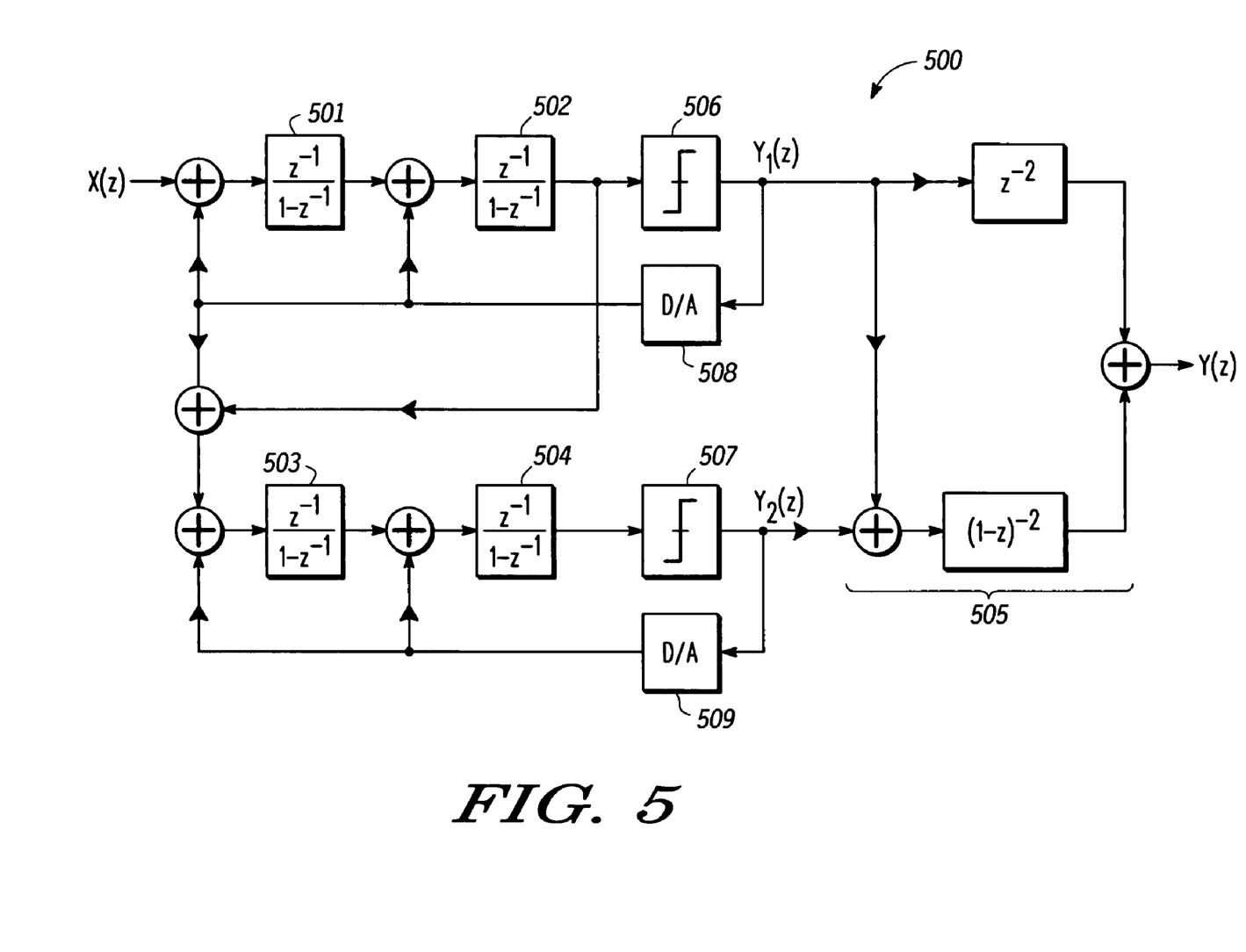
FIG. 5 is a 2-2 cascade sigma-delta modulator with real digital noise cancellation.

A real fourth-order cascade sigma-delta modulator 500 implemented using two second-order modulators is shown in FIG. 5. This system uses four real integrators, 501–504, to implement a 2-2 combination. Other combinations of real integrators, such as 1-1-1 and 2-1 to build a third-order system, or a 2-1-1 combination to build a fourth-order system, are also possible. The extension to even higher order systems is also possible. The system also employs real quantizers 506, 507, and real digital to analog converters. 508, 509. The outputs of the first and second stages are combined through a real noise cancellation circuit 505 to produce a final output Y(z).

In accordance with one aspect of the present invention, asymmetric noise shaping and cascading are combined in order to achieve a higher performance. The complex structure creates a single notch for quantization noise and cascading makes this notch deeper and wider. The general structure of a 2-2 cascade sigma-delta modulator 600 embodying one aspect of the present invention is shown in block diagram form in FIG. 6. The complex modulator includes a first-stage 601 cascaded with a second-stage 602. The first-stage 601 includes complex integrators 603 and 604, and quantizer 606, and second-stage 602 includes complex integrators 607, 608 and quantizer 609. The modulator also includes a complex digital noise cancellation circuit 611.

Figure 6:
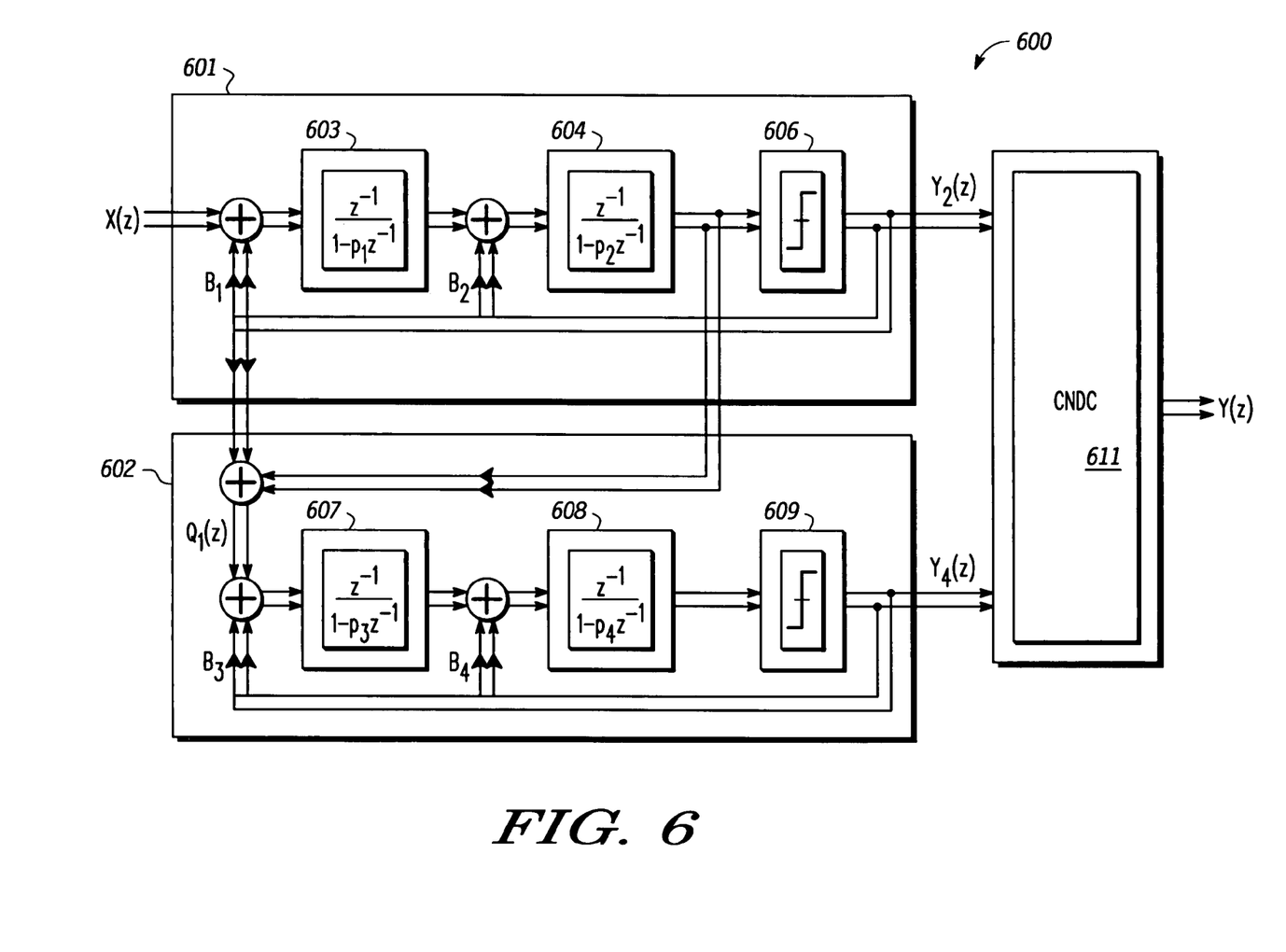
FIG. 6 is a block diagram of a complex 2-2 cascade sigma-delta modulator with complex digital noise cancellation, in accordance with one aspect of the present invention.

The output of the first-stage 601, $Y_1(z)$ $Y_2(z)$, and the second-stage 602, $Y_4(z)$, in FIG. 6 are described below in equations 1 and 2.

$$Y_2(z) = \frac{z^{-2}X(z)+(1-p_1z^{-1})(1-p_2z^{-1})Q_1(z)}{1+(B_2-p_1-p_2)z^{-1}+(B_1-B_2p_1+p_1p_2)z^{-2}} \quad (1)$$

$$Y_4(z) = \frac{z^{-2}X(z)+(1-p_3z^{-1})(1-p_4z^{-1})Q_2(z)}{1+(B_4-p_3-p_4)z^{-1}+(B_3-B_4p_3+p_3p_4)z^{-2}} \quad (2)$$

where $Q_1(z)$ and $Q_2(z)$ are the additive quantization noise based on a linear model for the quantizers 606, 609. In the above relations all variables, including the coefficients, are complex. Parameters $B_1$, $B_2$, $B_3$, and $B_4$ may be set as desired to achieve various results. In general, parameters $B_1$, $B_2$, $B_3$, and $B_4$ are set so that the denominators of equations 1 and 2 are equal. In this example, parameters $B_1$, $B_2$, $B_3$, and $B_4$ are set as shown in equations 3 and 4.

$$\begin{cases} B_1 = P_1^2 \\ B_2 = p_1 + p_2 \end{cases} \quad (3)$$

$$\begin{cases} B_3 = P_3^2 \\ B_4 = p_3 + p_4 \end{cases} \quad (4)$$

This choice results in:

$$Y_2(z)=z^{-2}X(z)+(1-p_1z^{-1})(1-p_2z^{-1})Q_1(z) \quad (5)$$

$$Y_4(z)=z^{-2}Q_1(z)+(1-p_3z^{-1})(1-p_4z^{-1})Q_2(z) \quad (6)$$

The output complex signal is obtained by combining the complex output signals of each stage 601, 602 using a complex noise cancellation circuit 611 with a complex transfer function NC(z):

$$Y(z)=z^{-2}Y_2(z)-NC(z)Y_4(z) \quad (7)$$

Substituting (5) and (6) in (7) leads to:

$$Y(z)=z^{-4}X(z)-(1-p_1z^{-1})(1-p_2z^{-1})(1-p_3z^{-1})(1-p_4z^{-1})\\Q_2(z \quad (8)$$

for:

$$NC(z)=(1-p_1z^{-1})(1-p_2z^{-1}) \quad (9)$$

Since $p_1$ and $p_2$ are both complex, NC(z) is also complex. The choice made in (3) and (4) allows the noise cancellation circuit 611 to be an FIR filter. The noise transfer function of the system is, $$NTF(z)=(1-p_1z^{-1})(1-p_2z^{-1})(1-p_3z^{-1})(1-p_4z^{-1}) \quad (10)$$

The four poles of the modulator, $p_1$, $p_2$, $p_3$, and $p_4$, may be all at a single frequency or may be distributed in an optimum fashion so as to maximize its SNR.

As stated above, $p_1=1+d_1jc_1$ and $p_2=1+d_2jc_2$. Thus, the noise cancellation transfer function may be expressed as: $NC(z),=NCr(z)+jNCi(z)$ where, $$\begin{cases} NCr(z) = 1 + (-2 - d_1 - d_2)z^{-1} + \\ (1 + d_1 + d_2 + d_1d_2 - c_1c_2)z^{-2} \\ NCi(z) = -(c_1 + c_2)z^{-1} + (c_1 + c_2 + c_1d_2 + c_2d_1)z^{-2} \end{cases} \quad (11)$$

Therefore, the coefficients $c_1$ and $c_2$ used for noise cancellation circuit 611 preferably match with the same coefficients used in the first stage 601 of the modulator 60. Any mismatch between may degrade the performance of the system. The real implementation of the complex cascade modulator in accordance with one exemplary embodiment of the invention is shown in FIG. 7.

Figure 7:
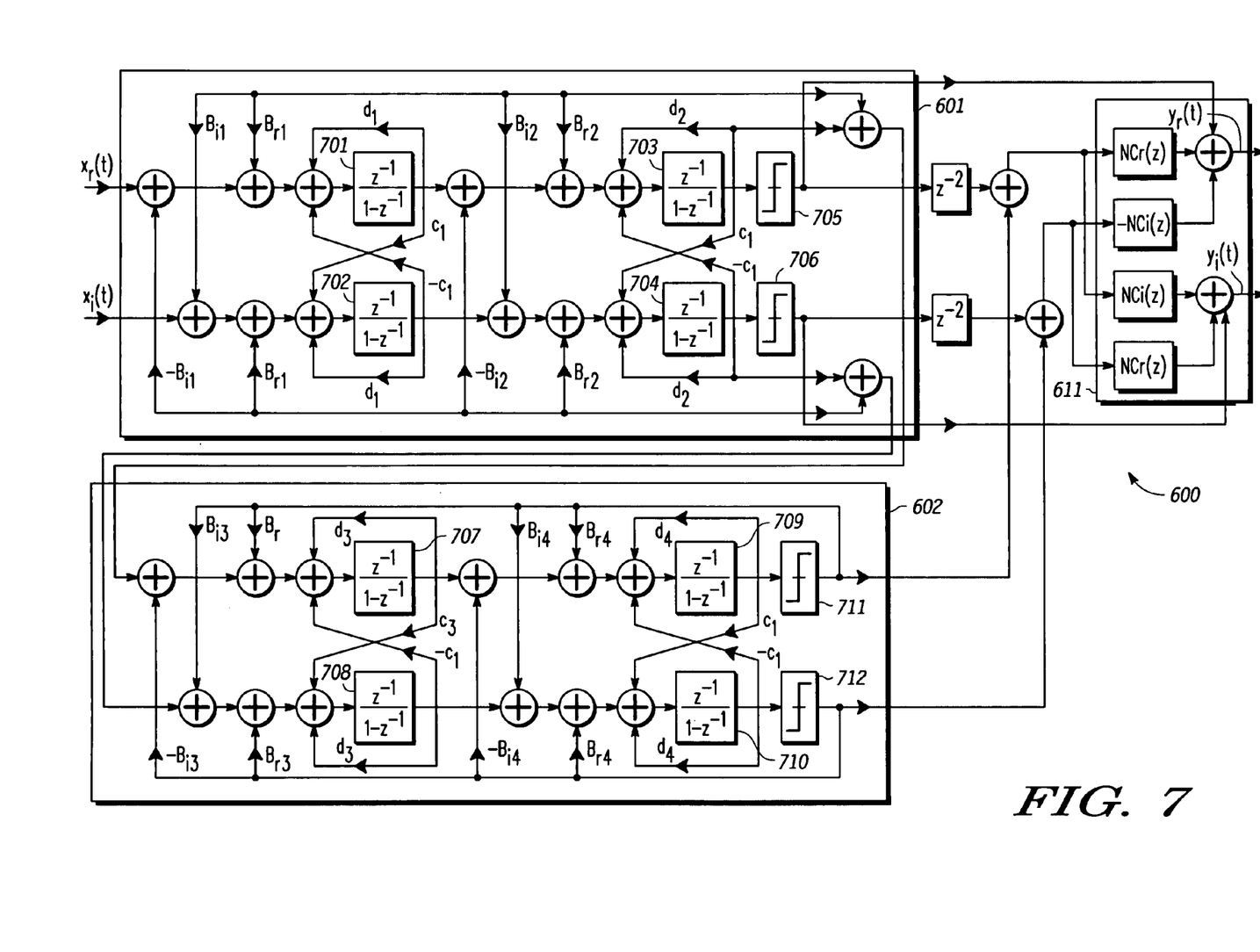
FIG. 7 is an implementation of the complex 2-2 cascade sigma-delta modulator of FIG. 6, using real components.

Referring to FIG. 7, complex cascaded sigma-delta modulator 600 may be implemented using real modulators and quantizers. For example, the first stage 601 of modulator 600 may include real integrators 701–704 and real quantizers 705, 706. Similarly, the second stage 602 of modulator 600 may include real integrators 707–710 and real quantizers 711, 712.

It should be noted that the system shown in FIG. 7 may be implemented in hardware, software and/or firmware, or a combination of hardware, software and firmware, without departing from the scope of the present invention.

Simulation results using Matlab-Simulink have shown that the complex cascaded sigma-delta modulator with complex noise cancellation system, constructed in accordance with FIG. 7 exhibits an excellent noise transfer function (corresponding to an excellent SNR, while at the same time exhibiting excellent immunity to coefficient variation).

Figure 8A:
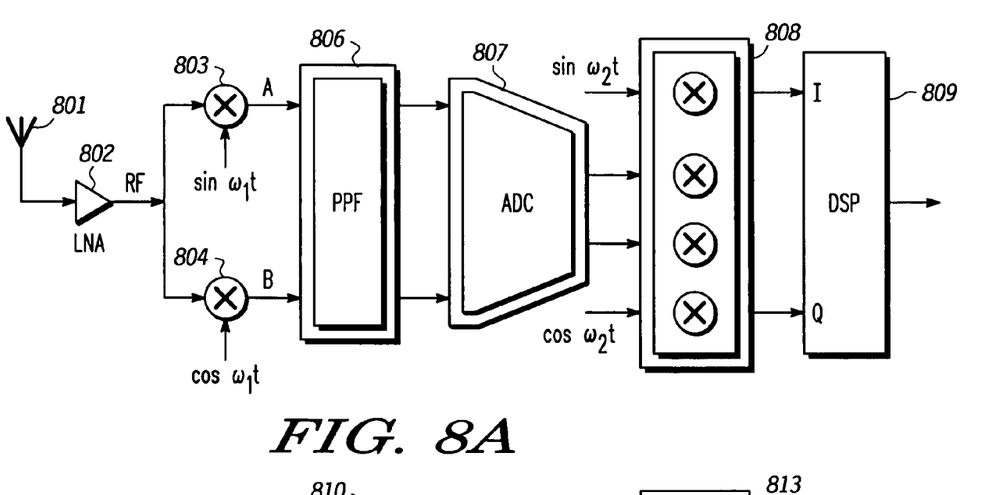
FIGS. 8A and 8B are block diagrams of radio frequency receivers using complex cascade sigma-delta modulators, in accordance with aspects of the present invention.
Figure 8B:
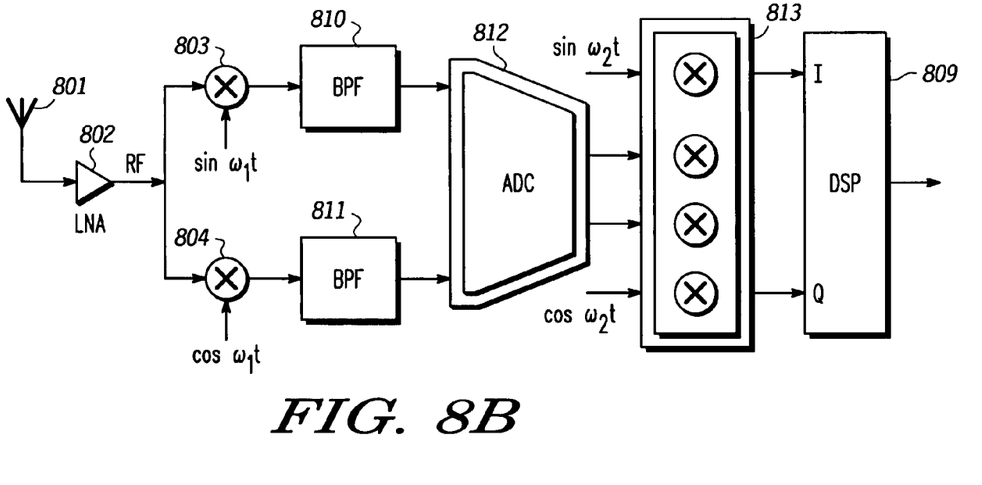

Referring to FIGS. 8A and 8B, presented are exemplary embodiments of practical applications of the invention in super-heterodyne receivers. In both FIG. 8A, antenna 801 is coupled to low noise amplifier 802 which produces an amplified radio frequency signal. The output of amplifier 802 is applied to mixers 803 and 804 along with quadrature local oscillator signals, SIN $\omega_1(t)$ and COS $\omega_1(t)$. The outputs of mixers 803 and 804 together represent a complex input signal A+jB that is asymmetric relative to DC with the desired signal located at positive frequencies and the image of the desired signal located at negative frequencies (or vice versa).

In FIG. 8A, the complex input signal A+jB, is applied to a polyphase filter 806 having an asymmetric frequency response with high attenuation at the image frequency. The outputs of polyphase filter 806 are applied to complex cascade ADC 807, which may have the structure and function of complex cascade sigma-delta ADC 600 described above. The digital outputs of complex cascade ADC 807 are then down-converted to baseband by complex mixer 808, to which are also applied oscillator signals SIN $\omega_2(t)$ and COS $\omega_2(t)$. The outputs of complex mixer 808, are the demodulated I and Q signals of the received signal, and may then be further processed, for example by DSP 809.

Alternatively, in FIG. 8B, the outputs of mixers 803 and 804, A+jB, are applied to real band pass filters 810 and 811, and then to complex cascade ADC 812. Once again, complex cascade ADC 812 may have the structure and function of complex cascade sigma-delta ADC 600 described in detail above. The digital outputs of ADC 812 are then down-converted to baseband by complex mixer 813, to which are also applied oscillator signals SIN $\omega_2(t)$ and COS $\omega_2(t)$. The outputs of complex mixer 813, are the demodulated I and Q signals of the received signal, and may then be further processed, for example by DSP 809.

Figure 9:
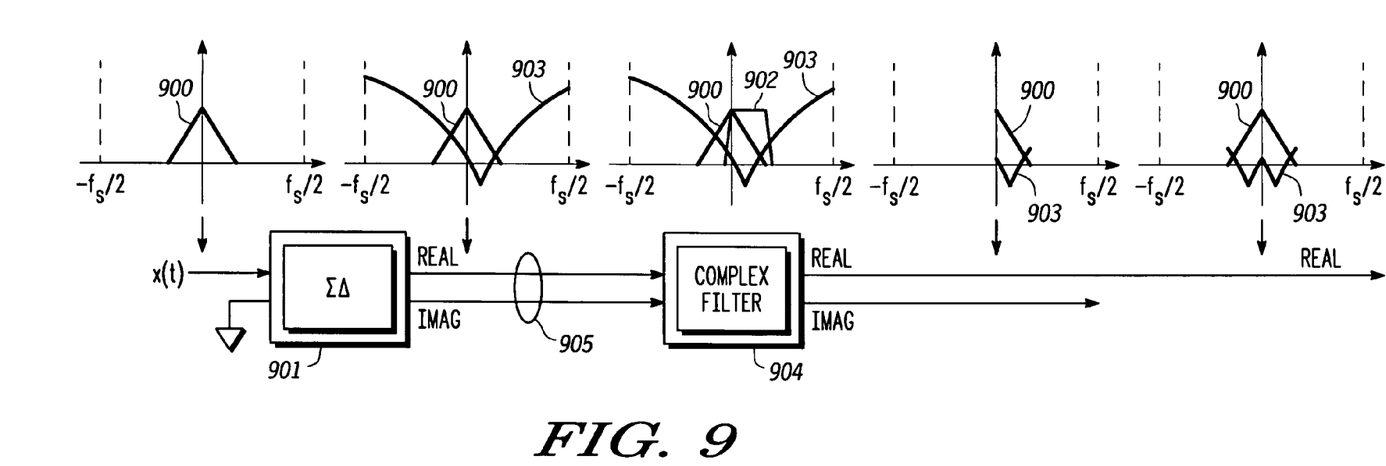
FIG. 9 is a block diagram with corresponding graphs of analog-to-digital conversion of a baseband signal using complex sigma-delta modulators and complex filters, in accordance with another aspect of the present invention.

Referring now to FIG. 9, disclosed is another aspect of the present invention in the conversion of baseband signals that have no or insignificant low frequency components. In this application, the input signal x(t) (900) has only a real component, and the complex sigma-delta modulator 901 receives only the real signal, and the imaginary input is grounded. Alternatively, the real signal x(t) may be applied to the imaginary input of sigma-delta modulator 901. In either case, the center frequency of the sigma-delta modulator 901 is required to be only half of the signal bandwidth. Complex modulator 901 may be designed so that quantization noise 903 is shaped to include only positive or only negative frequencies.

In one embodiment, sigma-delta modulator 901 may be a complex cascade sigma-delta ADC having a structure and function like that of complex cascade sigma-delta ADC 600, described above. In another embodiment, sigma-delta modulator 901 may be a complex sigma-delta modulator, such as that shown in FIGS. 4A and 4B, or it may be a complex sigma-delta modulator of conventional design, such as those disclosed in U.S. Pat. Nos. 6,225,928 or 6,329,939, the disclosures of each of which are incorporated herein by reference.

The output 905 of the complex sigma-delta modulator 901 is a complex signal, having both real and imaginary components, which are filtered by a digital complex filter 904 which removes out-of-band quantization noise. Filter 904 is a complex filter because the desired frequency response 902 is not symmetrical about DC. Complex filter 904 is of conventional design. Therefore, the quantization noise, 903, will be present only at positive frequencies in the signal bandwidth. By taking only the real output of filter 904, the complete signal spectrum at both positive and negative frequencies may be obtained. Mathematically, the output of the complex filter 904 is a complex signal $y(t)=y_r(t)+jy_i(t)$, where $y_r(t)$ and $y_i(t)$ are the real and imaginary parts of the output signal, respectively. Since the signal has no spectral components at negative frequencies, the imaginary part of the signal must be the Hilbert transform of the real part: $y(t)=y_r(t)+jH[y_r(t)]$, where $y_r(t)$ is a real signal having a spectrum that is symmetric about DC.

It should be noted that complex filter 904 may be combined with other digital filters for improved efficiency. Decimation filtering may also be performed at various stages of digital filter 904. In this application, a requirement of digital filter 904 is that it have high attenuation at negative frequencies in order to minimize the error introduced by unfiltered negative frequencies. Thus a sharp filter roll off at DC is preferred. For example, filter 904 may have a cutoff frequency at a positive frequency near DC. In this situation, frequency content between DC and the cutoff frequency may be lost, but this is of no concern if the signal being conditioned has no frequency components close to DC. For example, this embodiment of the invention has applicability to audio signals with no frequency components of interest below 50 Hz. and WCDMA signal with little spectral content below 10 kHz.

Figure 10:
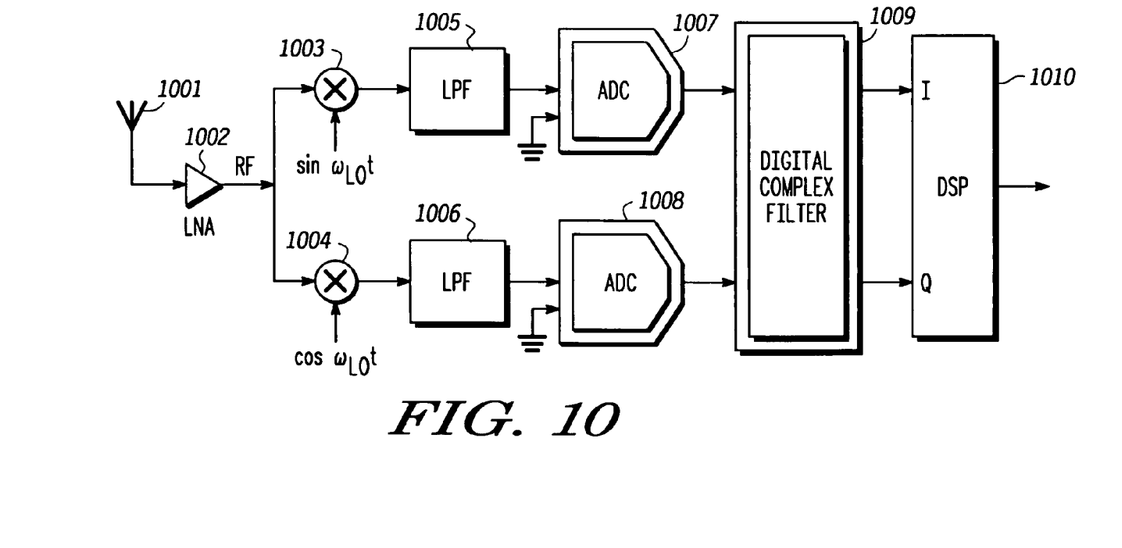
FIG. 10 is a block diagram of a radio frequency receiver using a complex sigma-delta modulator and complex filter at baseband, in accordance with an aspect of the present invention.

Referring now to FIG. 10, presented is an exemplary embodiment of a practical application of the invention in which baseband signals are ADC converted in a zero-IF (homodyne) receiver. In FIG. 10, antenna 1001 is coupled to the input of low noise amplifier 1002 which produces an amplified radio frequency signal that is applied to mixers 1003 and 1004. Also applied to mixers 1003 and 1004 are local oscillator signals SIN $\omega_{LO}(t)$ and COS $\omega_{LO}(t)$. The outputs of mixers 1003 and 1004 are baseband signals that are applied to low pass filters 1005 and 1006 and then to the un-grounded inputs of complex sigma-delta ADCs 1007 and 1008. Consistent with the operation of ADC 901 discussed above with reference to FIG. 9, ADCs 1007 and 1008 convert only half of the signal bandwidth. The digitized complex outputs of ADCs 1007 and 1008 are applied to complex digital filter 1009 which recovers the entire signal spectrum from the half-spectrum digital outputs of ADCs 1007 and 1008. The outputs of complex digital filter 1009 are the I and Q signals components of the received signal, and may then be further processed, for example by DSP 1010. It should be noted that complex digital filter 1009 may be a single structure as shown, or filter 1009 may be separate structures, with each structure filtering the complex output of one of the ADC's 1007 and 1008. Still further, the functions of complex digital filter 1009 maybe incorporated into the functions of DSP 1010.

The terms a or an, as used herein, are defined as one or more than one. The term plurality, as used herein, is defined as two or more than two. The term coupled, as used herein, is defined as connected, although not necessarily directly, and not necessarily mechanically.

All the disclosed embodiments of the invention disclosed herein can be made and used without undue experimentation in light of the disclosure. It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

What is claimed is:

1. A complex sigma-delta modulation method, comprising:
   receiving an input signal;
   mixing the input signal with oscillator signals to produce a complex asymmetric input signal having a real component and an imaginary component;
   applying a first complex sigma-delta modulation process to the complex asymmetric input signal to produce a first sigma-delta modulated signal;
   applying a second complex sigma-delta modulation process to the first sigma-delta modulated signal to produce a second sigma-delta modulated signal, the first and second complex signal sigma-delta modulation processes each including real integration processes coupling the output signal of the second complex sigma-delta with the complex asymmetric input signal at the first complex sigma-delta modulated process; and
   conditioning the first and second sigma-delta modulated signals using a complex noise cancellation process to produce an output signal.

2. The complex modulation method of claim 1, the first and second complex sigma-delta modulation processes each comprising multiple-order sigma-delta modulation processes.

3. The method of claim 1, the receiving step comprising receiving a radio frequency modulated signal.

4. The complex modulation method of claim 3, the mixing step comprising:
   mixing the radio frequency modulated signal with first and second quadrature local oscillator signals to produce the complex input signal.

5. An analog-to-digital converter, comprising:
   an input for receiving an input signal;
   a mixer for mixing the input signal with oscillator signals to produce a complex asymmetric input signal having a real component and an imaginary component;
   a first complex sigma-delta modulator, including a real integrator, for modulating the complex asymmetric input signal to produce a first sigma-delta modulated output signal;
   a second complex sigma-delta modulator, including a real integrator, coupled to the first complex sigma-delta modulator, for converting the first sigma-delta modulated signal into a second sigma-delta modulated signal coupling the output of second complex sigma-delta modulator to the complex asymmetric input signal at the first complex sigma-delta modulator; and
   a complex digital noise cancellation circuit, coupled to the first and second complex sigma-delta modulators, for canceling quantization noise and to produce a converter output signal from the first and second sigma-delta modulated output signals.

6. The analog-to-digital converter of claim 5, the first complex sigma-delta modulator comprising a multiple-order sigma-delta modulator circuit.

7. The analog-to-digital converter of claim 5, the second complex sigma-delta modulator comprising a multiple-order sigma-delta modulator circuit.

8. A complex modulator, comprising:
   an input for receiving an input signal;
   a mixer for mixing the input signal with oscillator signals to produce an asymmetric baseband input signal having a real and an imaginary component;
   a complex analog-to-digital converter for converting one of the real and imaginary components of the asymmetric baseband input signal into a quantized real output signal and a quantized imaginary output signal, the complex analog-to-digital converter comprising,
   a first complex sigma-delta modulator, including a real integrator coupled to the first complex sigma-delta modulator, for converting the first sigma-delta modulated signal into the quantized real output signal and the quantized imaginary output signal, and a second complex sigma-delta modulator including, a real integrator, coupled to the first complex sigma-delta modulator, for converting the first sigma-delta modulated signal into the quantized real output signal and the quantized imaginary output signal coupling the output of second complex sigma modulator to the complex asymmetric input signal at the first complex sigma-delta modulator; and a complex digital filter for filtering the complex real and imaginary output signals to produce a real filtered output signal.

9. The complex modulator of claim 8, further comprising: a radio frequency signal receiver for receiving a radio frequency input signal.

10. The complex modulator of claim 9, the radio frequency receiver comprising:
an antenna circuit coupled to the mixers for receiving a modulated radio frequency signal, the mixers converting the modulated radio frequency signal into an asymmetric baseband signal centered about DC.

11. The complex modulator of claim 10, the mixer mixing the modulated radio frequency signal with first and second quadrature local oscillator signals to produce the asymmetric baseband input signal.

12. A radio frequency receiver, comprising:
an input for receiving a modulated radio frequency signal;
a down converter coupled to the input for mixing the modulated radio frequency signal with oscillating signals to produce an asymmetric input signal having real and imaginary components;
an analog to digital converter coupled to the down converter, comprising:
a first stage including a complex sigma-delta modulator, including a real integrator, and having a first stage output; and
a second stage coupled to the output of the first stage including a complex sigma delta modulator, including a real integrator, and having a second stage output coupling the output of the second stage to an input terminal of the first stage; and
a complex digital noise cancellation circuit coupled to the outputs of the first and second stages, for canceling quantization noise and for producing a digitized output signal.

* * * * *